United States Patent

[11] 3,581,107

[72] Inventor Einer Dale Nielsen
Los Gatos, Calif.

[21] Appl. No. 714,645
[22] Filed Mar. 20, 1968
[45] Patented May 25, 1971

[73] Assignee Signetics Corporation
Sunnyvale, Calif.

[54] DIGITAL LOGIC CLAMP FOR LIMITING POWER CONSUMPTION OF INTERFACE GATE
3 Claims, 3 Drawing Figs.

[52] U.S. Cl. .......... 307/215, 307/237, 330/28
[51] Int. Cl. .......... H03k 19/36, H03k 5/08
[50] Field of Search .......... 307/254, 235, 215, 214, 237, 241

[56] References Cited

UNITED STATES PATENTS

| | | | |
|---|---|---|---|
| 2,887,542 | 5/1959 | Blair et al. .......... | 307/254 |
| 3,343,037 | 9/1967 | Kutz .......... | 307/254 |
| 3,394,268 | 7/1968 | Murphy .......... | 307/214 |
| 3,414,783 | 12/1968 | Moore .......... | 307/215 |
| 3,440,440 | 4/1969 | Prohofsky et al. .......... | 307/241 |

*Primary Examiner*—Donald D. Forrer
*Assistant Examiner*—L. N. Anagnos
*Attorney*—Flehr, Hohbach, Test, Albritton and Herbert

ABSTRACT: A NAND-type logic gate for interfacing high voltage logic levels with a low level output. Feedback means including a diode are coupled between the base input of an amplifier which is coupled to the input logic terminals and the output. The feedback functions to clamp the input of the amplifier to a relatively low voltage to cause a dropping resistor between the high voltage power supply and the base input of the amplifier to have an increased voltage drop with increased power supply voltage to thus maintain the drive of the amplifier substantially constant. On the other hand, the feedback path is also coupled to ground through an output transistor to thus reflect load current changes to allow the drive voltage to the amplifier to increase in response to increased drive requirements. The diode in the feedback path provides for nonlinearity to thus prevent oscillations.

INVENTOR.
EINER DALE NEILSEN
Flehr, Hohbach, Test, Albritton & Herbert
ATTORNEYS

DIGITAL LOGIC CLAMP FOR LIMITING POWER CONSUMPTION OF INTERFACE GATE

BACKGROUND OF THE INVENTION

The present invention is directed to a digital logic gate and more specifically to an interface gate which provides for translation of relatively high voltage input logic levels to relatively low voltage logic levels.

In digital logic circuits it is often necessary to interface from high voltage to low voltage levels. For example, in a NAND gate it may be necessary to provide translation from up to 30-volt logic levels to a standard logic level of 5 volts. The high voltage input may vary over a large range of values and thus the interface gate circuitry must be designed to encompass this voltage swing. The design must, at the same time, provide a workable circuit over the operating temperature range and also retain the required switching speeds. Finally, the interface gate must be responsive to variations in loads while still maintaining flexibility as to variations in the high voltage levels.

In the past, some interface gates have had some of the above capabilities but only at the expense of having the interface gate overdriven a considerable amount. This has lowered efficiency, reduced the operating life of individual components and impaired other characteristics, such as switching time and uniform response over a temperature range.

OBJECTS AND SUMMARY OF INVENTION

It is therefore a general object of the present invention to provide an improved interface gate.

It is another object of the invention to provide an interface gate which is responsive to a broad range of high voltage input logic levels while still maintaining a high efficiency and good switching speeds.

It is another object of the invention to provide an interface gate as above which prevents the overdriving of circuit components and is still capable of supplying a broad range of output currents.

In accordance with the above objects there is provided a logic gate for interfacing high logic level voltages with low logic level voltages. The gate has a high level input and a low level output. The output switches between two low level logic states in response to changes in the high level input. The logic gate comprises first switching means for coupling the output to a source of potential representing one level of the low level logic and second switching means for clamping the output to the other level of the low level logic. A power source is coupled to the high level input. Amplifying means are provided having a control input responsive to the high level input and also having output means coupled to the first and second switching means for selectively activating them. Feedback means couple the output of the logic gate to the input of the amplifier through a series connected diode for maintaining the input of the amplifier at a level related to the output load current requirements when the second switching means is clamping the logic gate output to the other level of the low level logic.

DETAILED DESCRIPTION OF PREFERRED EMBODIMENT

Figures 1, 2, 3:
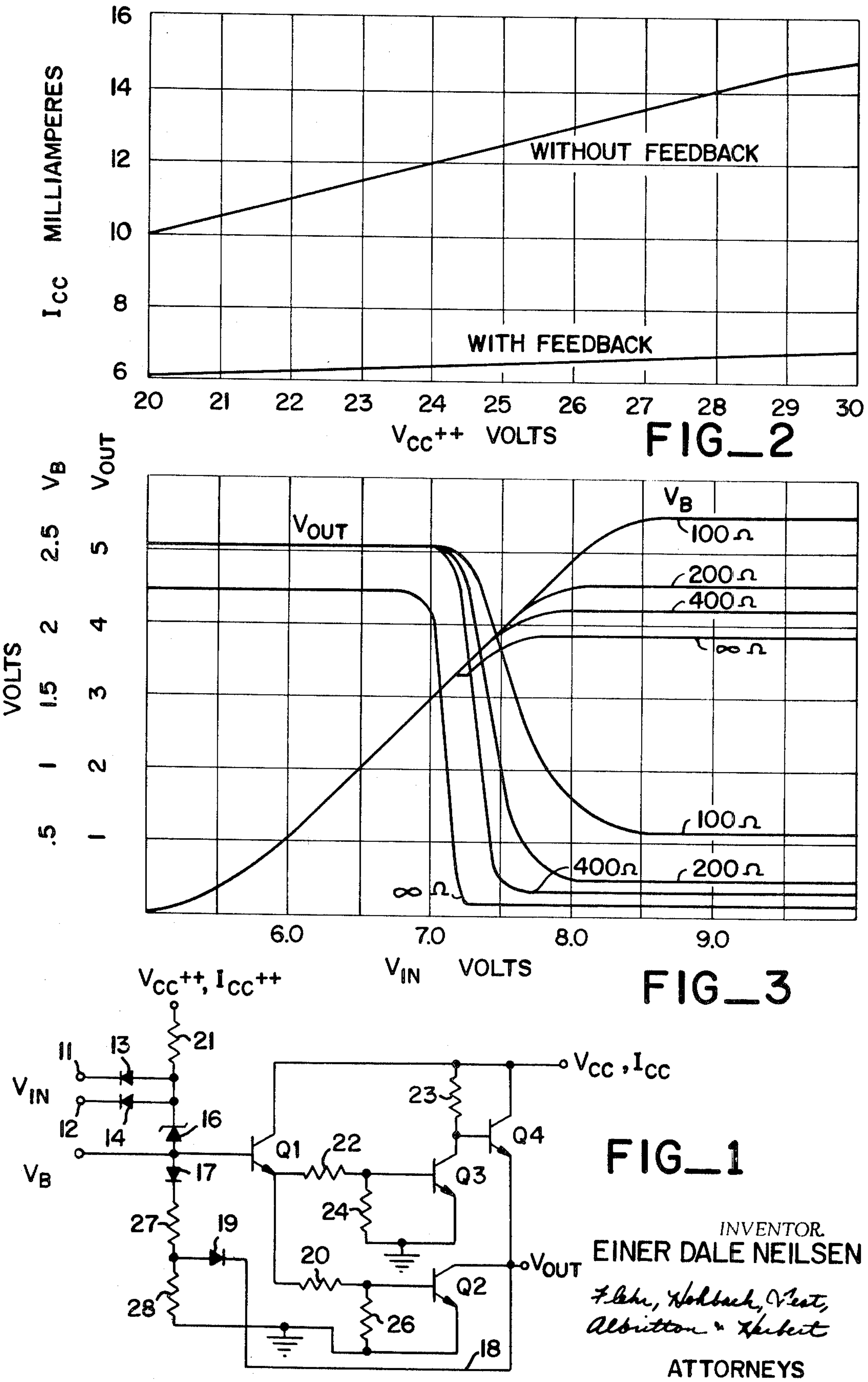
FIG. 1 is a schematic circuit diagram of a logic gate embodying the present invention.
FIG. 2 is a graph useful in understanding the present invention.
FIG. 3 is another graph useful in understanding the invention.

Referring now to the schematic diagram of FIG. 1, the specific logic gate shown is that of NAND logic. Positive DC coupled logic terminology will be used with an output level which is up or high being termed a binary 1 and an output level which is at a low voltage being termed a binary 0. The $V_{in}$ terminals 11 and 12 are coupled through respective diodes 13 and 14 to the base input of a transistor Q1 through a Zener diode 16. The NAND gate shown operates from two power supplies one of which is designated $V_{cc}^{++}$ with a current of $I_{cc}^{++}$. The high voltage power supply $V_{cc}^{++}$ may vary between 20 volts and 30 volts and will accept input voltage swings on terminals 11, 12 of from 8 volts to 30 volts. The low voltage power supply, $V_{cc}$ operates at a standard 5 volts.

The high voltage power supply $V_{cc}^{++}$ is coupled through a 20 k. dropping resistor 21 to diodes 13 and 14 and Zener diode 16 and then to the base of Q1. Q1 has a collector coupled to the low voltage power supply $V_{cc}$. The emitter output of Q1 is coupled through a 700-ohm resistor 22 to the base input of the transistor Q3 and to the base input of a transistor Q2 through a 600-ohm resistor 20 which has its collector output coupled to the base input of a transistor Q4. The collector of Q4 is coupled to $V_{cc}$ and its emitter is coupled to $V_{out}$ and provides a relatively high level output, $V_{cc}$, when Q4 is conducting. Biasing is provided to the base of Q4 through an 860-ohm resistor 23 coupled to $V_{cc}$. In the case of transistor Q3 a 4 k. resistor 24 is coupled between its base and ground. With reference to the low level logic state of $V_{out}$, Q2 has its collector coupled to $V_{out}$ and when on clamps $V_{out}$ to ground through its emitter. Biasing is provided to Q2 by a 2.3 k. ohm resistor 26 coupled between the base and ground.

Biasing is provided for the base input of transistor Q1 through a diode 17 coupled to its base input which is coupled to ground through series connected resistor 27 and 28 which have component values of 580 ohms and 4.9 k. ohms, respectively.

In accordance with the invention the $V_{out}$ voltage is also fed back through line 18, diode 19, resistor 27 and diode 17 to a test point labeled $V_B$. This is at the base of transistor Q1.

OPERATION

In general, when $V_{out}$ is in its high state one of the terminals 11 or 12 will be clamped to ground causing Q1 to be in an off condition. Q3 will therefore be off turning Q4 on and coupling, in effect, $V_{cc}$ to the output. Q2, since its base input is supplied from Q1, will also be in an off condition.

With the coincidence of voltages of sufficient magnitude on both inputs 11 and 12, Q1 will be turned on along with Q2 and Q3 and Q4 will be turned off. Q2 will now couple $V_{out}$ to ground and thus place the output terminal of the NAND gate in its low level logic state.

Thus, Q4 constitutes switching means for coupling the output, $V_{out}$, to a source of potential $V_{cc}$ representing one level of the low level logic and transistor Q2 represents second switching means for clamping the output to the other level of the low level logic.

Q1 serves as amplifying means having a control input, which is its base input, responsive to the coincidence of high level inputs on terminals 11 and 12 for selectively activating either transistor Q4 or transistor Q2.

Feedback means include line 18 coupled between $V_{out}$ and back to the input of Q1 through series connected diode 19, resistor 27 and diode 17. This feedback maintains the input to Q1 at a level related to the output load current requirements when $V_{out}$ is in its low level logic state with Q2 conducting as will be explained below.

The provision of this feedback also allows for variation of the high voltage power supply $V_{cc}^{++}$ over its operating range of 20 to 30 volts and thus provides for a full temperature range of operation from a −55° C. to a +125° C. In addition, turnoff times of the NAND gate switch are maintained at substantially 25 nanoseconds by reduction of excess drive voltage. More specifically, during on conditions of Q2, resistor 28 is effectively bypassed through line 18 and diode 19. Any attempt to overdrive Q1 and thus Q2 is reflected in an increase in current through dropping resistor 21 and feedback line 18. This lowers or tends to lower the base input drive to Q1.

The graph of FIG. 2 illustrates how feedback line 18 tends to maintain the load current through Q1 at a constant value even with rising values of the power supply $V_{cc}^{++}$. As illustrated on the graph with the feedback line 18 connected, a change of the power supply voltage from 20 to 30 volts results in less than a milliampere rise in the current through Q1 from $V_{cc}$. In contrast, the curve designated "without feedback" indicates that the overdriving of Q1 with the power supply voltage $V_{cc}^{++}$ causes an increase over the same voltage range of almost 5 milliamperes. Of course, this causes excessive heating of the driving transistor Q1 and requires that the circuit be designed in the absence of the provisions of the present invention to accommodate this range of current. The slope of the "-with feedback" curve is determined primarily by resistor 21 since it is relatively large in value as compared to resistor 27 and the resistance of Q2.

In addition to accommodating changes in the power supply voltage, the logic gate of the present accommodates changes in the load current requirement as illustrated in FIG. 3. One set of curves labeled $V_{out}$ indicates the change in output voltage when switching between the high level state which is approximately 5 volts ($V_{cc}$) to the low level logic state (1 volt and less) with changes in load resistance of 100 ohms, 200 ohms, 400 ohms and an open circuit. $V_{cc}^{++}$ has been adjusted to 24 volts and $V_{cc}$ is 5 volts. The temperature of the circuit was 125° C. Also superimposed is the test point $V_B$ also taken at the different load resistances. The horizontal axis of the graph is the input voltage on 11 and 12. As is illustrated by the $V_B$ curves as the load increases or resistance decreases, $V_B$ stays high to supply the excess drive needed. Once the output is low $V_B$ returns to its lower value. In other words, if under load more current is being sunk by the output the voltage at the base of Q1 will rise, meaning $V_B$ will rise by an amount necessary to provide sufficient drive to the base of Q2.

However, on the other hand, if this drive is not necessary the clamping effect of feedback line 18 and diode 19 reduces the drive voltage at the base of Q1. This is provided by drawing a greater current through the 20k. resistor by the lowering of $V_B$. The clamping action provided by feedback line 18 is nonlinear in function because of diode 19. As the diode 19 begins to conduct there is very little feedback since the dynamic resistance of the diode is relatively high. However, as the voltage $V_{out}$ is lowered or the voltage at the base of Q1 raised as the $V_{in}$ is raised the feedback becomes larger. This nonlinear feedback is believed to dampen any potential oscillation.

Thus, the present invention provides an improved logic gate which is operable at varying power supply voltages and load currents while still maintaining good efficiency and switching speeds.

I claim:

1. A logic gate for interfacing high logic level voltages with low logic level voltages said gate having a high level input and a low level output said output switching between two low level logic states in response to changes in said high level input said gate comprising, first switching means for coupling said output to a source of potential representing one level of said low level logic, second switching means for clamping said output to the other level of said low level logic, a power source coupled to said high level input, amplifying means having a control input responsive to said high level input and having output means coupled to said first and second switching means for selectively activating them, and feedback means coupling said logic gate output to said input of said amplifier through a series connected diode for maintaining said input of said amplifier at a level related to the output load current requirements when said second switching means is clamping said output to said other level of said low level logic.

2. A logic gate as in claim 1 together with a series dropping resistor between said power source and said control input of said amplifying means and in which said feedback means is clamped substantially to ground through said second switching means so that variations in the magnitude of the voltage supplied by said power source are minimized by said dropping resistor.

3. A logic gate as in claim 1 in which said series connected diode in said feedback means provides a nonlinear feedback for minimizing oscillatory effects.